(12) United States Patent
Brown

(10) Patent No.: US 6,657,435 B2
(45) Date of Patent: Dec. 2, 2003

(54) AUDIBLE CIRCUIT BREAKER

(76) Inventor: Richard A. Brown, 850 Bright Meadow Dr., Lake Mary, FL (US) 32746

( * ) Notice: Subject to any disclaimer, the term of this patent is extended or adjusted under 35 U.S.C. 154(b) by 82 days.

(21) Appl. No.: 09/956,385

(22) Filed: Sep. 19, 2001

(65) Prior Publication Data

US 2002/0057089 A1 May 16, 2002

Related U.S. Application Data

(60) Provisional application No. 60/233,933, filed on Sep. 20, 2000.

(51) Int. Cl.[7] .................. G01R 31/00; G01R 19/14; H01R 11/00; H01R 31/00
(52) U.S. Cl. .................. 324/508; 324/133; 324/526; 439/504; 439/641
(58) Field of Search .................. 324/133, 524, 324/526, 508, 522, 610, 72.5, 119; 439/504, 623, 641, 645; 340/656

(56) References Cited

U.S. PATENT DOCUMENTS

| | | | |
|---|---|---|---|
| 4,155,082 A | 5/1979 | Jones et al. | |
| 4,272,142 A | * 6/1981 | Zapf | 439/504 |
| 4,551,672 A | * 11/1985 | Hadley et al. | 324/133 |
| 4,725,772 A | 2/1988 | Peak | |
| 4,816,746 A | 3/1989 | Peak | |
| 4,945,346 A | * 7/1990 | Schmiemann | 340/656 |
| 4,963,854 A | 10/1990 | Stuecker | |
| 5,319,306 A | 6/1994 | Schuyler | |
| 5,331,283 A | 7/1994 | Sheldon | |
| 5,370,542 A | * 12/1994 | Beach et al. | 439/148 |

* cited by examiner

Primary Examiner—Anjan K. Deb
(74) Attorney, Agent, or Firm—William M. Hobby, III

(57) ABSTRACT

An audible test circuit has a body having a plurality of prongs extending therefrom and having a plurality of lights thereon. A four way bridge rectifier circuit has a voltage steering circuit for producing a DC output voltage of known polarity located in the body. An audible alarm, is coupled to the four way bridge rectifier circuit for producing an audible alarm when power is applied to the rectifier circuit while lamps indicate the plurality of circuit connections. The audible test circuit may include a lamp socket-to-alligator clip attachment for coupling the alligator clip to the circuit. There is also a lamp socket-to-alligator clip attachment.

2 Claims, 2 Drawing Sheets

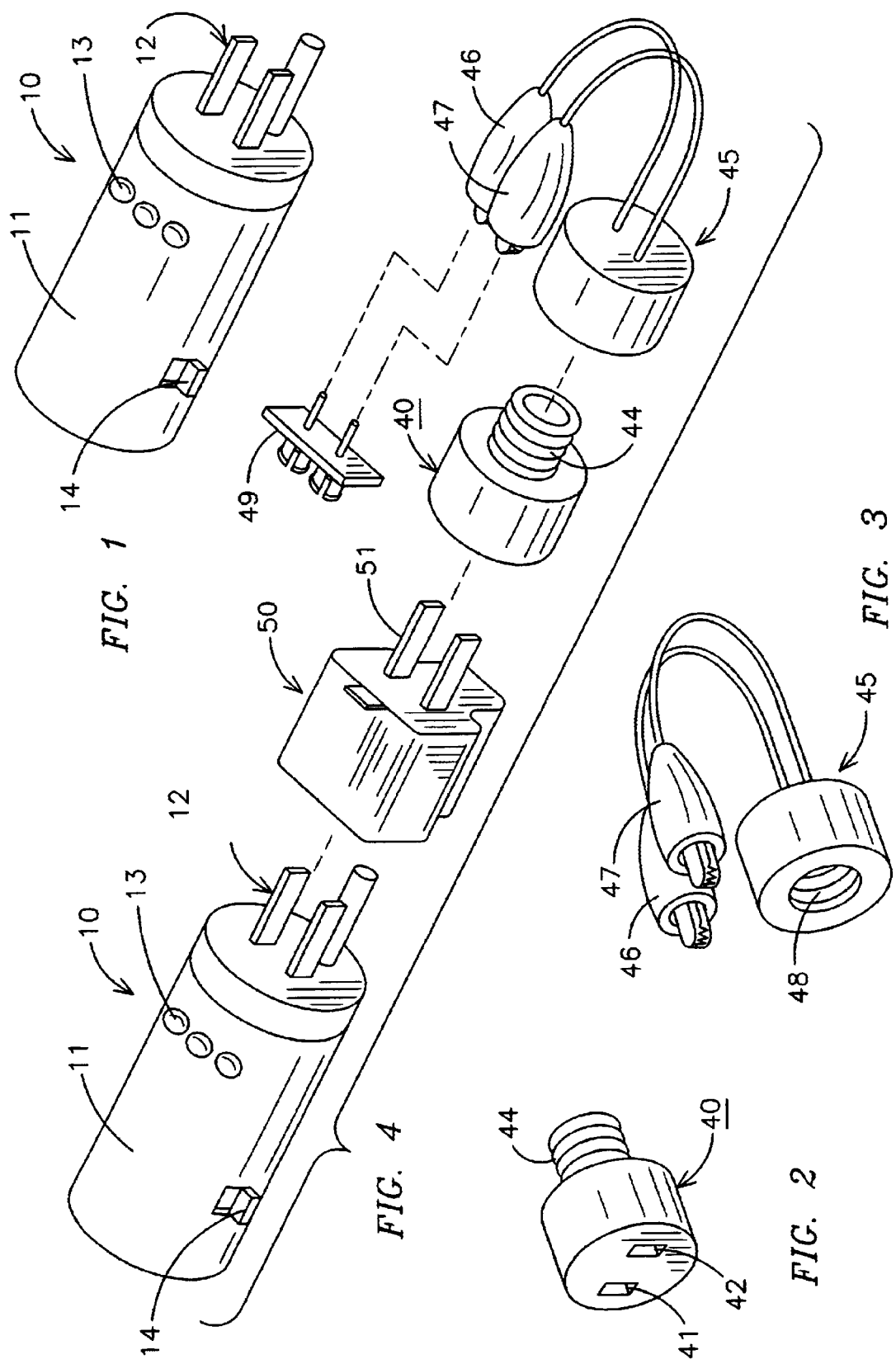

AUDIBLE CIRCUIT BREAKER

This application claims the benefit of Provisional Application No. 60/233,933, filed Sep. 20, 2000.

BACKGROUND OF THE INVENTION

The present invention relates to an audible circuit breaker/fuse finder for testing electrical circuits to determine which of a plurality of prewired circuits a particular circuit is connected and whether an outlet is live and safe.

When an electrician, construction worker, or home owner has to service or change an outlet or electrical device, it is a safe practice to shut-off the circuit breaker or fuse supplying power. When unmarked, finding the proper fuse or circuit breaker is time consuming and wastes the time of the electrician, especially when the electrician is working alone. In many cases, the fuse box or circuit breakers will be located at a considerable distance from the outlet of the circuit breaker being traced, even on a different floor of a building. This requires many trips back and forth between the outlet and fuse breaker box before the proper circuit is identified.

The Schmiemann U.S. Pat. No. 4,945,346 is an audible circuit tracer for indicating audibly the presence of electrical power in an outlet. The circuit is also placed in a cylindrical housing containing a step-down transformer, a full wave rectifier and a piezo-electric buzzer for sounding in the presence of electric power. In FIGS. 3 and 4, a cylindrical tester has a light socket for attaching thereto for testing power at the light socket and a female plug for connecting a pair of wires having alligator clips on the end thereof. The Jones U.S. Pat. No. 4,155,082 teaches a power failure warning circuit which is plugged into a receptacle and produces a distinctive warning when the power supply is reconnected. It uses a full wave rectifier and a speaker. The Stuecker U.S. Pat. No. 4,963,854 shows a lightbulb shaped audio signal emitter which can be attached into a lamp socket to emit an audio alarm signal when the lightbulb socket is energized. The Sheldon U.S. Pat. No. 5,331,283 shows an apparatus for detecting a complete electrical circuit in an electrical output receptacle and includes an audible alarm. In FIG. 4 of the drawings, an attachment is provided which plugs into the electrical plugs and has wires and alligator clips. The Schuyler U.S. Pat. No. 5,319,306 is a portable electrical line tester using audible tones to indicate voltage. Each of the two Peak U.S. Pat. Nos. 4,725,772 and No. 4,186,746 shows a circuit for determining the presence or absence of electrical power at a receptacle and each shows in one view the use of an electric lamp socket attachment and a female attachment having wires extending therefrom with alligator clips on the end thereof. None of these prior patents perform continuity or polarity tests.

The present invention provides a circuit siren in a small cylindrical hand-held plug-in test device which is combined with attachments to provide an audible multiple input voltage presence indicator and an audible circuit breaker fuse finder and an audible continuity tester and a standard 120 volt AC receptacle polarity ground visual indicator and an audible live telephone jack tester and an audible standard lightbulb socket voltage presence indicator and a 120 volt AC lightbulb socket and two wire system visual polarity indicator. The circuit has a high/low volume switch on it for desired sound output. The audible section enunciates on any voltage between 3–130 volts, AC or DC. Visual LED polarity lights are provided for diagnoses of standard 120 volt AC outlets but will operate within the voltage range of the circuit. The LED light functions in the circuit to provide an accurate polarity indication for two wire circuits as well as three wire circuits, which is important in connecting wires on typical light fixtures for connecting the fixture with the right polarity so that the outside of the electrical socket in the light fixture is not the portion of the light socket that is connected to the hot wire. With the circuit attached to a standard lightbulb socket with the power going to the socket, the LED lights will depict whether the light fixture has proper polarity or not when the grounding jumper is connected to the grounding adapter prong and a ground wire or metal chain on the fixture. The variable visual indicators are able to accept multiple voltages to indicate partial power situations in standard lightbulb sockets and receptacles. Loose or corroded connections can sometimes have only 70–80 volts at the typical lightbulb socket or receptacle so as not to allow a typical polarity indicator or lightbulb to light up.

SUMMARY OF THE INVENTION

An audible test circuit has a body having a plurality of prongs extending therefrom and having a plurality of lights thereon. A four way bridge rectifier circuit has a voltage steering circuit for producing a DC output voltage of known polarity located in the body and coupled to the plurality of prongs extending therefrom into the plurality of lights thereon to produce a visual indication of power to said bridge rectifier circuit on the polarity of the circuit being tested. An audible alarm, such an electronic transducer, is coupled to the four way bridge rectifier circuit for producing an audible alarm when power is applied to the rectifier circuit. The lamp attachment is removably attachable to the plurality of prongs for attaching the audible test circuit to a lamp socket for testing the lamp socket for power and polarity so that an audible test circuit gives an audible indication of power applied to the circuit and a visual indication of the plurality of the circuit. The audible test circuit may include a lamp socket-to-alligator clip attachment for removably attaching to the lamp attachment for coupling the alligator clip to the circuit. There is also a lamp socket-to-alligator clip attachment.

BRIEF DESCRIPTION OF THE DRAWINGS

Other objects, features, and advantages of the present invention will be apparent from the written description and the drawings in which:

FIG. 1 is a perspective view of an audible testing circuit in accordance with the present invention;

FIG. 2 is a perspective view of a lamp socket attachment;

FIG. 3 is a perspective view of an alligator clip to lamp socket attachment;

FIG. 4 is an exploded perspective view of the audible testing circuit of FIG. 1 and attachments therefor.

DESCRIPTION OF THE PREFERRED EMBODIMENT

Figure 5:
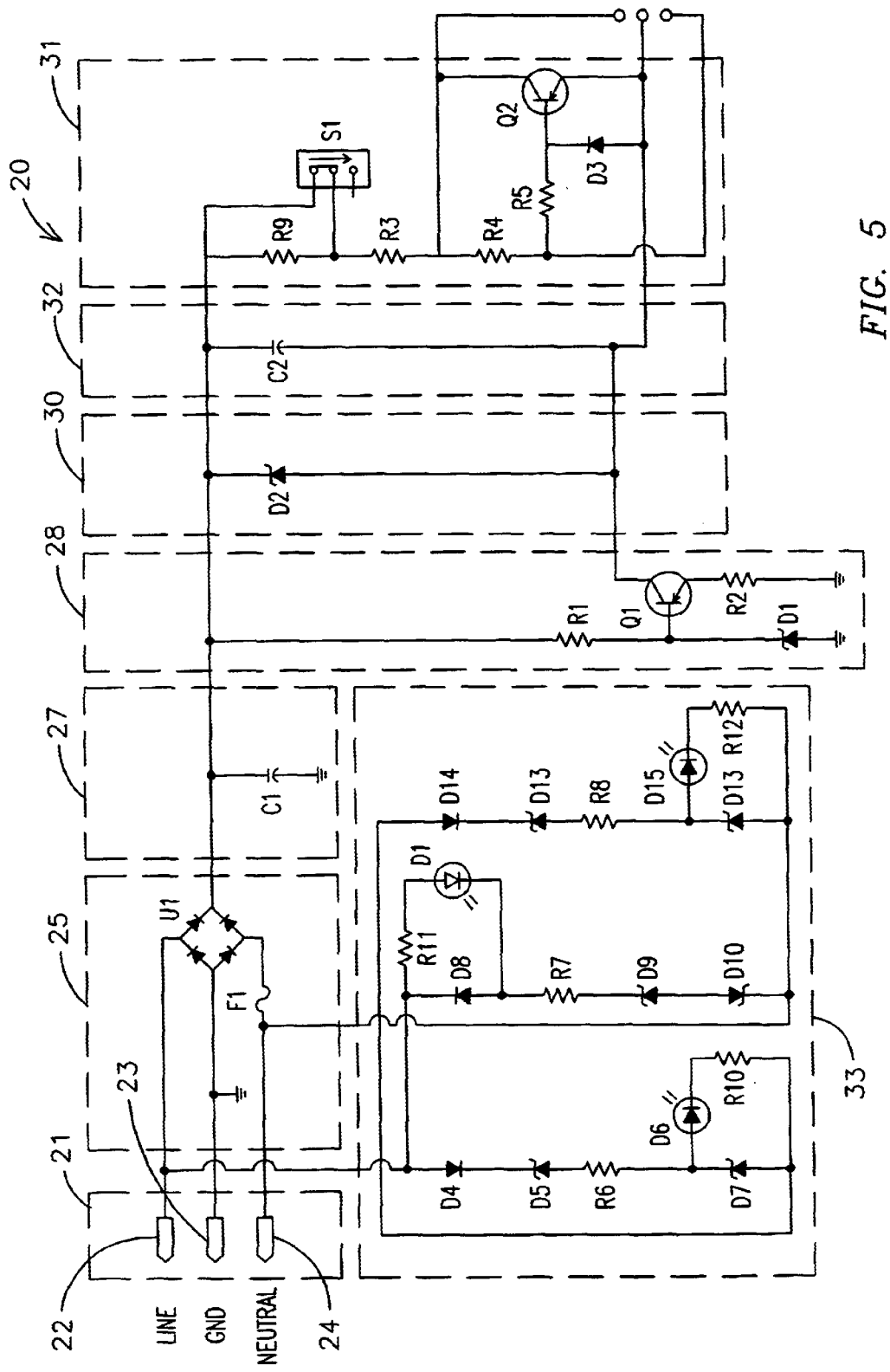
FIG. 5 is a schematic diagram of the circuit for the audible circuit tester.

Referring to FIGS. 1 and 4 of the drawings, an audible test circuit apparatus 10 has a cylindrical body 11 and a three prong plug 12 protruding from one end and a plurality of LED test lights 13 on the side thereof. The three LED's 13 include a red LED and two green LEDs. The red light denotes any problem condition. There is also a high-low volume switch 14 on the side of the circuit.

In FIG. 2 a lamp socket attachment 40 has a two prong receptacle 41 and 42 and lamp bulb threads on a lap socket attaching portion 44. FIG. 3 is a lamp bulb attachment 45 having a pair of insulated alligator clips 46 and 47 and having a lamp bulb socket 48. The alligator clips allow the tester more flexibility in testing circuits and continuity.

Referring more specifically to FIG. 4, an audible test circuit apparatus 10 has a three prong plug 12, shown in exploded view adjacent a three-to-two prong adapter 50 having prongs 51 for insertion into the lamp socket attachment 40. The lamp socket attachment 40 has the lamp bulb threads 44 of FIG. 2 shown attached to the lamp socket to alligator clip attachment 45. A 9 volt battery clip 49 has a pair of conductors extending therefrom to allow one of the alligator clips to be attached thereto. When a 9 volt battery and one alligator clip is attached, the test circuit becomes a continuity tester. Each of the attachments can be attached together or separately to provide a test circuit for a two prong type plug or for a lamp socket threaded connector for the attachment of FIG. 2 or for attaching alligator clips 46 and 47 for flexibility and testing circuits and continuity. A grounding jumper wire with an uninsulated alligator clip at each end is used to connect a ground to the circuit as needed, such as for completion of the continuity adapter. One end attaches to the 9-volt battery clip 49 and the other is used in conjunction with the leftover lead of the circuit siren pigtail socket adapter to determine continuity. Also when testing polarity on a 2 wire light bulb socket, one end of the jumper is attached to the ground tab on the 3 into 2 adapter and the other is attached to a ground wire or a fixture metallic chain to determine polarity in a typical light socket. The combination of attachments allows rapid flexibility by attaching or removing attachments in different order for different circumstances. The circuit siren and polarity light section starts to illuminate at a voltage level of 40 volts. In many outlet receptacles that have loose or corroded connections, there still may be power present, however the typical polarity testers do not illuminate until there is 110 volts applied giving the user no reading at all when in fact there may be 60–100 volts present. This makes for a safer working/testing environment with more dependability. Users of the circuit siren also benefit safetywise from the fact that there is sound presence even when there is a broken neutral wire at the back of the receptacle it is being plugged into.

Referring to FIG. 5, the circuit of the present invention 20 is illustrated in schematic form having an input 21 which is the point in the circuit that an electrical connection is made to the circuit being tested and has the prongs 22, 23, and 24. Prong 24 is neutral while prong 23 is the ground and prong 22 is the hot line. The prongs are connected to a four-way rectifier 25 connected between the fuse 26 and a filter 27. The four-way bridge rectifier provides a voltage steering function such that DC voltage may be applied without regard to polarity and such that the AC voltage applied will become a full-way rectified voltage. The output of this circuit produces a DC voltage of known polarity regardless of the input. The filter 27 is a capacity filter used to reduce ripple voltages when the input has an AC voltage applied. A current source 28 is a high voltage current source and applies a constant current load to the filter 27 and is used as an element of the floating power supply 30. The high voltage current source supplies all of the operating current required by the floating power supply, oscillator and buzzer. The floating power supply 30 is an 18 volt power supply which provides a constant operating voltage to the oscillator buzzer circuit 31. A filter 32 is also a capacity filter which functions as a charge reservoir for the floating power supply 30 and reduces any ripple voltage present at the floating power supply. The oscillator 31 is a feedback oscillator which is used in conjunction with a feedback signal from the buzzer and is used to create a buzzer drive voltage that operates at or near the resonance of the buzzer. The buzzer utilizes a ceramic diaphragm buzzer which produces an audible sound whenever sufficient AC or DC voltage is applied to the input of the circuit. Interconnected to the circuit is also the outlet wiring indicator 33 which is used to give an indication of polarity of the prongs 22, 23, and 24.

The schematic drawing components part numbers and values may be as follows:

| | |
|---|---|
| R1 = 17k 5% | D1 = 4.7 v |
| R2 = 330Ω 5% | D2 = 18 v Zmm5248Bct |
| R3 = 680Ω 5% | |
| R4 = 180k 5% | D4 = BAS21 |
| R5 = 10k 5% | D5 = 18 v Zmm5248Bct |
| R6 = 22k 5% | D6 = Green |
| R7 = 22k 5% | D7 = 18 v Zmm5248Bct |
| R8 = 22k 5% | D8 = 18 v Zmm5248Bct |
| R9 = 10k 5% | D9 = 18 v Zmm5248Bct |
| R10 = 2.2k 5% | |
| R11 = 2.2k 5% | D11 = Green |
| R12 = 2.2k 5% | D12 = 18 v Zmm5248Bct |
| | D13 = 18 v Zmm5248Bct |
| C1 = .1 μf 200 v | D14 = Bas Z1 |
| C2 = 10 μf | D15 = Red |
| | D18 = Bas21 |

It should be clear that the present circuit is illustrated in a standard receptacle plug configuration but any number of attachments can be provided, such as a socket attachment to the three plug, for inserting the circuit tester within a lamp socket. A plug can also be made for providing a two-line lead for testing continuity in a circuit and for a plug for insertion into a non-grounded two-plug receptacle. However, the present invention is not to be construed as limited to the forms shown which are to be considered illustrative rather than restrictive.

I claim:

1. An audible test circuit comprising
   a body having a plurality of prongs extending therefrom and having a plurality of lights thereon;
   a four way bridge rectifier circuit having a voltage steering circuit for producing a DC output voltage of known polarity, said bridge rectifier circuit being located in said body and coupled to said plurality of prongs extending therefrom and to said plurality of lights thereon to produce a visual indication of power applied to said bridge rectifier circuit and of the polarity of the circuit being tested;
   audible alarm means coupled to said four way bridge rectifier circuit for producing an audible alarm when power is applied to said rectifier circuit;
   a lamp attachment removably attachable to said plurality of prongs for attaching said audible test circuit to a lamp socket for testing said lamp socket for power and polarity;
   a lamp socket to alligator clip attachment for removably attaching to said lamp attachment for coupling said alligator clips to said plurality of prongs, said lamp socket to alligator clip attachment having internal threads for receiving a light bulb and said lamp attachment having external threads matching said lamp socket to alligator clip attachment internal threads for removably attaching said attachments together;
   whereby a audible testing circuit gives an audible indication of power applied to a circuit and a visual indication of polarity in the circuity.

2. The audible test circuit in accordance with claim 1 including a three prong to two prong electrical connector is removably attached to said body plurality of prongs and said lamp attachment is attached to said prongs.

* * * * *